(12) United States Patent
Cheng et al.

(10) Patent No.: US 10,170,537 B2
(45) Date of Patent: Jan. 1, 2019

(54) CAPACITOR STRUCTURE COMPATIBLE WITH NANOWIRE CMOS

(71) Applicant: INTERNATIONAL BUSINESS MACHINES CORPORATION, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 14/581,043

(22) Filed: Dec. 23, 2014

(65) Prior Publication Data

US 2016/0181352 A1 Jun. 23, 2016

(51) Int. Cl.
*B81B 1/00* (2006.01)
*H01L 27/06* (2006.01)
*H01L 49/02* (2006.01)
*H01L 29/06* (2006.01)
*H01L 29/41* (2006.01)

(52) U.S. Cl.
CPC ............... *H01L 28/60* (2013.01); *B81B 1/00* (2013.01); *H01L 27/0629* (2013.01); *H01L 29/0669* (2013.01); *H01L 29/0673* (2013.01); *H01L 29/413* (2013.01)

(58) Field of Classification Search
None
See application file for complete search history.

(56) References Cited

U.S. PATENT DOCUMENTS

| | | | |
|---|---|---|---|
| 7,217,946 B2 | 5/2007 | Fraboulet et al. | |
| 7,564,085 B2 | 7/2009 | Jang et al. | |
| 7,667,296 B2 | 2/2010 | Stumbo et al. | |
| 9,219,154 B1 * | 12/2015 | Cheng | H01L 29/7853 |
| 2007/0012985 A1 | 1/2007 | Stumbo et al. | |
| 2010/0155702 A1 | 6/2010 | Wernersson | |
| 2014/0051705 A1 | 2/2014 | Cundy et al. | |
| 2014/0209854 A1 | 7/2014 | Bangsaruntip et al. | |
| 2014/0209864 A1 | 7/2014 | Bangsaruntip et al. | |

* cited by examiner

*Primary Examiner* — Shaun M Campbell
*Assistant Examiner* — Aneta B Cieslewicz
(74) *Attorney, Agent, or Firm* — Tutunjian & Bitetto, P.C.; L. Jeffrey Kelly

(57) ABSTRACT

A semiconductor device is provided that includes a pedestal of an insulating material present over at least one layer of a semiconductor material, and at least one fin structure in contact with the pedestal of the insulating material. Source and drain region structures are present on opposing sides of the at least one fin structure. At least one of the source and drain region structures includes at least two epitaxial material layers. A first epitaxial material layer is in contact with the at least one layer of semiconductor material. A second epitaxial material layer is in contact with the at least one fin structure. The first epitaxial material layer is separated from the at least one fin structure by the second epitaxial material layer. A gate structure present on the at least one fin structure.

12 Claims, 6 Drawing Sheets

CAPACITOR STRUCTURE COMPATIBLE WITH NANOWIRE CMOS

BACKGROUND

Technical Field

The present disclosure relates to electrical devices, such as semiconductor devices including capacitor structures.

Description of the Related Art

Semiconductor circuits typically include both active semiconductor devices, such as transistors and diodes, as well as passive devices, such as resistors and capacitors. As semiconductor technology has advanced over several decades, both the active semiconductor devices and the passive devices have conventionally been scaled to increasingly smaller dimensions to reduce costs. Capacitors are one of the fundamental components in today's electro is devices and operate by storing a charge.

SUMMARY

In one aspect, a method of forming an electrical device is provided that includes forming a stacked structure of at least a first semiconductor material layer and a second semiconductor material layer. The material of the first and second semiconductor material layers have a different oxidation rates. The method further includes oxidizing a sidewall of the stacked structure to form an oxide layer, wherein a first thickness of a first portion of the oxide layer on the first semiconductor material layer is different from a second portion of the oxide layer having a second thickness on the second semiconductor material. The first or second portion of the oxide thickness having the lesser thickness is removed to provide an exposed surface of the stacked structure. An epitaxial semiconductor material is formed on the exposed surface of the stacked structure. The portions of the stacked structure having the epitaxial semiconductor material have a greater width than the portions of the stacked structure not including the epitaxial semiconductor material. A dielectric layer is formed on exposed portions of the stack structure having the epitaxial material. A conductive material is formed on the dielectric layer, wherein the stacked structure including the epitaxial material, the dielectric layer, and the conductive material provide a capacitor structure.

In another aspect, a capacitor structure is provided that includes a plurality of nanowires having a central portion with a cross-sectional width less than a cross sectional width of end portions for the nanowires. The capacitor structure also includes a node dielectric layer on the central portion of the plurality of nanowires; and a conductive material on the node dielectric layer, wherein the conductive material, the node dielectric layer and the central portion of the nanowires provides the capacitor.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
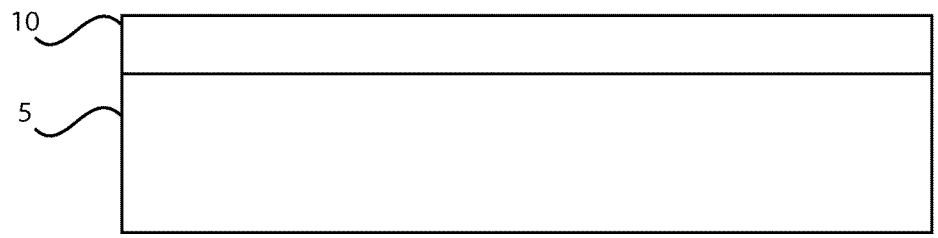
FIG. 1 is a side cross-sectional view of a first semiconductor material layer on a semiconductor substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on", and "over" mean that a first element, such as a first structure, is present on a second element, such as a second structure, wherein intervening elements, such as an interface structure, e.g. interface layer, may be present between the first element and the second element. The terms "direct contact" and "contacting" mean that a first element, such as a first structure, and a second element, such as a second structure, are connected without any intermediary conducting, insulating or semiconductor layers at the interface of the two elements.

The methods and structures disclosed herein provide capacitor structures using finFET processing steps. In this manner, a capacitor may be integrated with finFET devices with minimal changes to the process sequence for forming the finFETs. A "capacitor" is a structure for storing a charge including two electrically conductive materials separated and insulated from each other by a dielectric. The term "electrode" as used to describe a component of the capacitor represents one of the two electrically conductive materials of the capacitor that are separated by the dielectric layer. A "node dielectric layer" is the dielectric layer that is present between the electrodes of the capacitor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A Fin Field Effect Transistor (FinFET) is a semiconductor device that positions the channel region of the semiconductor device in a fin structure. The methods and structures that are disclosed herein are now discussed with greater detail by referring to FIGS. 1-11B.

FIG. 1 depicts one embodiment of a first semiconductor material layer 10 being formed on a substrate 5. In some embodiments, the substrate 5 may have a single crystal, i.e., monocrystalline, crystal structure. In some embodiments, the substrate 5 is composed of a silicon including material. In some embodiments, the silicon including material that provides the substrate 5 may include, but is not limited to silicon, single crystal silicon, multi-crystalline silicon, polycrystalline silicon, amorphous silicon, strained silicon, silicon doped with carbon (Si:C), silicon alloys or any combination thereof. In other embodiments, the substrate 5 may be a semiconducting material that may include, but is not limited to, germanium (Ge), silicon germanium (SiGe), silicon germanium doped with carbon (SiGe:C), germanium alloys, GaAs, InAs, InP as well as other III/V and II/VI compound semiconductors. The substrate 5 may also be composed of a dielectric, such as an oxide, a metal or a glass material.

The first semiconductor material layer 10 may be deposited on the substrate 5. The first semiconductor material layer 10 is selected from the group consisting of Si, SiGe, SiGeC, a III-V semiconductor material and a combination thereof. For example, the first semiconductor material layer 0 is comprised of $Si_{1-x}Ge_x$, wherein x=0-0.5. The first semiconductor material layer 10 may be deposited using a deposition process, such as chemical vapor deposition (CVD). Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. In some embodiments, the first semiconductor material layer 10 may be formed using an epitaxial deposition process.

"Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. The term "epitaxial material" denotes a semiconductor material that has been formed using an epitaxial growth and/or epitaxial deposition process. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus. The thickness of the first semiconductor material layer 10 may range from 10 nm to 100 nm.

Figure 2:
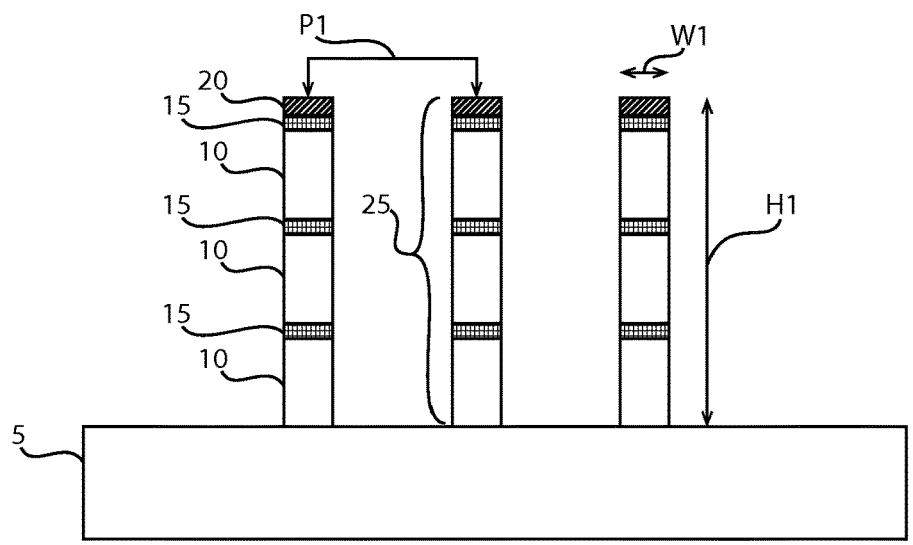
FIG. 2 is a side cross-sectional view of forming a stacked structure of at least a first semiconductor material layer and a second semiconductor material layer, wherein a material of the first and second semiconductor material layers have a different oxidation rates, in accordance with one embodiment of the present disclosure.

A second semiconductor material layer 15 may then be formed on the first semiconductor material layer, wherein a plurality of first and second semiconductor material layers 10, 15 is formed atop the second semiconductor material layer 15 in sequence to form a layered structure of semiconductor materials for forming the stacked structures 25 depicted in FIG. 2. The composition of the second semiconductor material layer 15 is selected to have a different oxidation rate from the first semiconductor material layer 10. For example, the second semiconductor material layer 15 may be selected to have a faster oxidation rate than the first semiconductor material layer 10. The second semiconductor material layer 15 may be selected from the group consisting of SiGe, a III-V semiconductor material and a combination thereof. In one example, when the first semiconductor material layer 10 is composed of $Si_{1-x}Ge_x$, wherein x=0-0.5, the second semiconductor material layer 15 may be comprised of $Si_{1-y}Ge_y$, wherein y>x. The second semiconductor material layer 15 may be formed using a chemical vapor deposition (CVD) process, similar to the above described CVD processes for forming the first semiconductor material layer 10. The second semiconductor material layer 15 may be an epitaxial formed material. The thickness of each of the second semiconductor material layers 15 may range from 10 nm to 100 nm.

Following the formation of the material layer that will provided the uppermost first or second semiconductor material layer 10, 15, a hard mask dielectric layer 20 is formed atop the layered structure. The hard mask dielectric layer 20 may be composed of an oxide, nitride or oxynitride material layer. For example, the hard mask dielectric layer 20 may be composed of an oxide, such as silicon oxide. In another example, the hard mask dielectric layer 20 may be composed of a nitride, such as silicon nitride. The hard mask dielectric layer 20 may be deposited using a chemical vapor deposition (CVD) process, such as the CVD processes that have been described above for forming the first and second semiconductor material layers 10, 15. In some other embodiments, the hard mask dielectric layer 20 can be formed using thermal oxidation.

FIG. 2 depicts one embodiment of forming a plurality of stacked structures 25, wherein each stacked structure 25 includes the hard mask dielectric layer 20, at least one first semiconductor material layer 10 and at least one second semiconductor material layer 15. The plurality of stacked structures 25 typically has similar dimensions to fin structures that may also be present on the same substrate as the plurality of stacked structures 25. In this manner, it can be easy to integrate the capacitors that are formed herein into a process sequence that forms finFET semiconductor devices.

For example, the stacked structures 25 may be formed using deposition, photolithography and etch processes. In one example, the stacked structures 25 may be formed using sidewall image transfer (SIT) methods. More specifically, in one example of a SIT method, a sacrificial mandrel is first formed on a surface of the material layer, i.e., hardmask dielectric layer 20, for forming the at least one stacked structure 25. The sacrificial mandrel may be formed using deposition, patterning and development processes. Thereafter, a deposition process, such as chemical vapor deposition (CVD), provides a dielectric profile on the sidewalls of the sacrificial mandrel. The sacrificial mandrel may then be removed. For example, sacrificial mandrel can be removed using a chemical strip or selective etching. In some examples, the sacrificial mandrel is amorphous carbon. In some examples, the sacrificial is amorphous silicon. Following removal of the sacrificial mandrel, the dielectric profile remains to provide an etch mask, which can be used to etch the hardmask dielectric layer 20. The first and second semiconductor material layers 10, 15 are then etched using the dielectric profile, and the etched hard mask dielectric layer 20, as an etch mask to define the geometry and dimensions of the least one stacked structure 25. The etch process for forming the at least one stacked structure 25 may be an anisotropic etch, such as reactive ion etching (RIE). The above described process for defining the at least one stacked structure 25 may be used to form fin structures for finFETs simultaneously on a different portion of the substrate 5.

Referring to FIG. 2, each of the stacked structures 25 may have a height H1 ranging from 15 nm to 500 nm. In another embodiment, each of the stacked structures 25 has a height H1 ranging from 30 nm to 100 nm. In one example, each of the stacked structures 25 has a height H1 ranging from 30 nm to 60 nm. Each of the stacked structures 25 may have a width W1 of less than 20 nm. In another embodiment, each of the stacked structures 25 has a width W1 ranging from 5 nm to 10 nm. Although only three stacked structures 25 are depicted in FIG. 2, the present disclosure is not limited to only this example. It is noted that any number of stacked structures 25 may be present on the substrate 5. The pitch P1, i.e., center of as stacked structure to center of adjacent stacked structure distance, separating adjacent stacked structures 25 may range from 10 nm to 500 nm. In another example, the pitch P1 separating adjacent stacked structures 25 may range from 20 nm to 50 nm.

Figure 3:
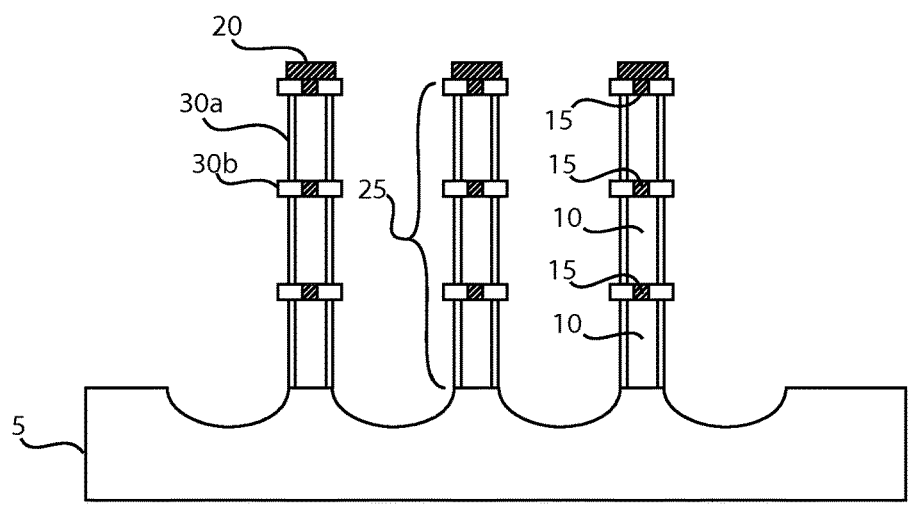
FIG. 3 is a side cross-sectional view of oxidizing a sidewall of the stacked structure to form an oxide layer, in accordance with one embodiment of the present disclosure.

FIG. 3 depicts one embodiment of oxidizing a sidewall of the stacked structure 25 to form an oxide layer 30. The oxide layer 30 may include two or more portions having a different thickness that results from the different oxidation rates of the material layers 10, 15 that provide the stacked structure 25. For example, the portion of the oxide layer 30 that is present on the first semiconductor material layer 10, i.e., first portion 30a of the oxide layer, may have a lesser thickness (in the width direction of the stacked structure 25) than the portion of the oxide layer 30 that is present on the second semiconductor material layer 15, i.e., the second portion of the oxide layer 30b. Oxidation of the sidewall of the stacked structure may include thermal oxidation, in which the stacked structure 25 is exposed to an oxygen containing atmosphere at an elevated temperature, i.e., above room temperature, e.g., greater than 20° C. to 25° C. In some example, thermal oxidation of the silicon containing sidewalls of the stack structure 25 may be at a temperature ranging from 800° C. to 1200° C. Subjecting the semiconductor surface of the stacked structure 25 to an oxygen containing environment at elevated temperature causes oxygen atoms to diffuse into the material layer of the stacked structure, i.e., first and second semiconductor material layers 10, 15, wherein the greater the oxidation rate of the material, the greater the depth within the material that the oxygen can diffuse to form an oxide. Oxide may also be formed on the exposed surface of the substrate 5.

The thickness of the oxide layer 30 may range from 1 nm to 30 nm, in which one of the first and second portions of the oxide layer having the greater thickness may be 2.5 nm to 10 nm thicker than the other portion of the oxide layer 30 having the lesser thickness. In another embodiment, the thickness of the oxide layer 30 may range from 5 nm to 20 nm, in which one of the first and second portions of the oxide layer having the greater thickness may be 5 nm to 7.5 nm thicker than the other portion of the oxide layer 30 having the lesser thickness.

Figure 4:
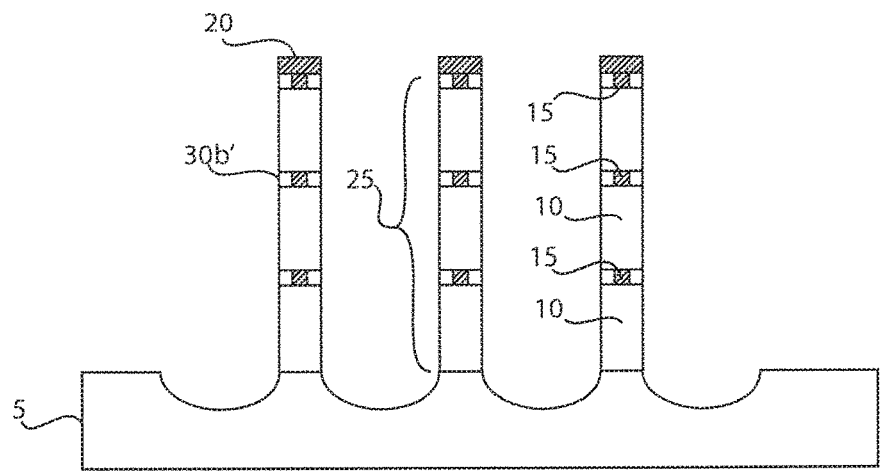
FIG. 4 is a side cross-sectional view of removing the first or second portion of the oxide thickness having a lesser thickness to provide an exposed surface of the stacked structure, in accordance with one embodiment of the present disclosure.

FIG. 4 depicts removing the first or second portion of the oxide layer 30 having a lesser thickness to provide an exposed surface of the stacked structure 25. In the embodiment that is depicted in FIG. 4, the first portion 30a of the oxide layer is removed. A portion of the oxide layer, e.g., the second portion 30b of the oxide layer, typically remains on the sidewall of the stacked structure 25. Removing the first portion 30a of the oxide layer may include an isotropic etch. The term "isotropic" denotes that the etch is non-directional. For example, etch process for removing the first portion 30a of the oxide layer may be a wet chemical etch or a dry etch. The etch process for removing the first portion 30a of the oxide layer may also remove a portion of the second portion 30b of the oxide layer, but because the second portion 30b of the oxide layer has a greater thickness than the first portion 30a of the oxide layer, a remaining portion 30b' of the second portion still remains on the sidewall of the stacked structures 25 following the etch process. The etch process may be timed to be terminated after a sidewall, such as the sidewall of the first semiconductor material layer 10, has been exposed.

Figure 5:
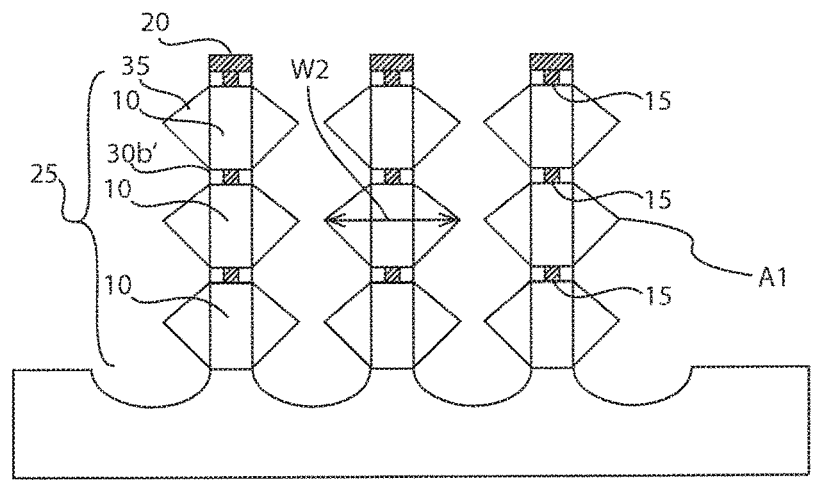
FIG. 5 is a side cross-sectional view of forming an epitaxial semiconductor material on the exposed surface of the stacked structure, in accordance with one embodiment of the present disclosure.

FIG. 5 depicts forming an epitaxial semiconductor material 35 on the exposed surface of the stacked structure 25. The epitaxial semiconductor material 35 may be formed using an epitaxial deposition process, and is selectively deposited only on the exposed sidewalls, e.g, exposed sidewall of the first semiconductor material layer 10, of the stacked structure 25. Epitaxial material is not deposited on the remaining portions 30b' of the oxide layer and/or the hardmask dielectric 20. In some examples, in which an amorphous material is formed on the dielectric materials during the epitaxial deposition process, the amorphous material may be removed by an etch process that is selective to the epitaxial material that is being deposited by the epitaxial deposition process.

In some embodiments, the epitaxial semiconductor material 35 may be composed of the same composition material as the first semiconductor material layer 10 to provide a homogeneous arrangement, or the epitaxial semiconductor material 35 may be composed of a different composition material as the second semiconductor material layer 15 to provide a heterogeneous arrangement. Therefore, any of the materials described above for the first semiconductor material layer 10 are suitable for the description of the epitaxial semiconductor material 35. For example, the epitaxial semiconductor material layer 35 may be comprised of $Si_{1-x}Ge_x$, wherein x=0-0.5.

As noted above, the epitaxial semiconductor material layer 35 may be deposited using an epitaxial deposition process, which may employ the deposition chamber of a chemical vapor deposition chamber, similar to the above description of the epitaxial deposition processes used to form the first and second semiconductor material layers 10, 15. In some embodiments, in which the semiconductor material that forms the epitaxial semiconductor material 35 is composed of silicon germanium (SiGe), the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The epitaxial semiconductor material is typically formed having a half diamond, i.e., triangular shape, when viewed from a side cross section, as depicted in FIG. 5. In the embodiment that is depicted in FIG. 5, the half diamond shape includes an apex A1 that is present substantially at a middle of a length of the first semiconductor material layer 10. Still referring to FIG. 5, in some embodiments, the remaining portion 30b' of the oxide layer may optionally be further oxidized as this step of the process sequence to fully oxidize the sandwiched second semiconductor material layers 15 and to trim the nanowires (as described further below).

Following formation of the epitaxial semiconductor material layer 35, the cross-sectional width W2 of the stacked structures 25 may range from 10 nm to 200 nm. In another embodiment, the cross-sectional width W2 of the stacked structures 25 may range from 30 nm to 60 nm. This cross sectional width W2 represents the final cross sectional width of the end portions of the stacked structure 25 in the capacitor structure produced by the present method. As will be described in the following portions of the disclosure, the central portion of the stacked structure 25 will have a reduced cross sectional width, when compared with the cross-sectional width of the end portions of the stacked structures 25 (also referred to as nanowires).

Figure 6A:
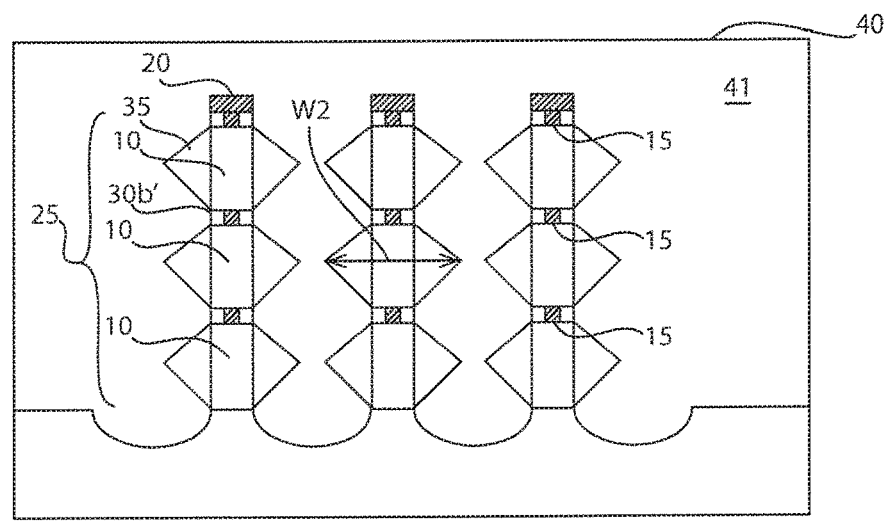
FIG. 6A is a side cross-sectional view depicting a dummy gate on a first portion of the stacked structure, in accordance with the present disclosure.
Figure 6B:
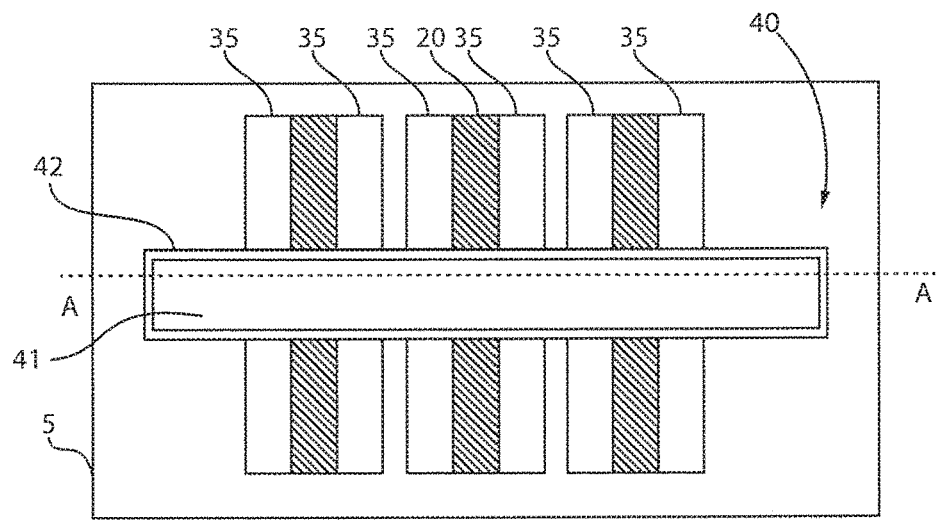
FIG. 6B is a top down view of the structure depicted in FIG. 6A.

FIGS. 6A and 6B depict one embodiment of forming a replacement structure 40 on a central portion, i.e., first portion, of the stacked structure 25. FIG. 6A is a side cross sectional view along section line A-A depicted in FIG. 6B. As used herein, the term "replacement structure" denotes a sacrificial structure that dictates the geometry and location of the later formed functioning structure. In the present case, the replacement structure is replaced with a functioning structure that provides the node dielectric and an electrode of the capacitor structure. In the present disclosure, because the method for forming the capacitors is to employ a process sequence that is suitable for use with finFET semiconductor devices, the replacement structure is referred to as a replacement gate structure. This terminology is suitable in this instance because the geometry and positioning of the replacement structure 40 is similar to the geometry and positioning of the replacement gate structure of a finFET forming process sequence.

In one embodiment, the sacrificial material 41 of the replacement structure 40 may be composed of any material that can be etched selectively to the stacked structure 25 and the substrate 5. In one embodiment, the sacrificial material 41 of the replacement structure 40 may be composed of a silicon-including material, such as polysilicon.

In some embodiments a sidewall spacer 42 is formed on the sidewall of the replacement structure 40. In one embodiment, the sidewall spacer 42 may be formed by using a blanket layer deposition process, such as CVD, and an anisotropic etchback method. The sidewall spacer 42 may have a width ranging from 2.0 nm to 15.0 nm, and may be composed of a dielectric, such as a nitride, oxide, oxynitride, or a combination thereof. In one example, the sidewall spacer 42 may be composed of silicon oxide ($SiO_2$).

Figure 7A:
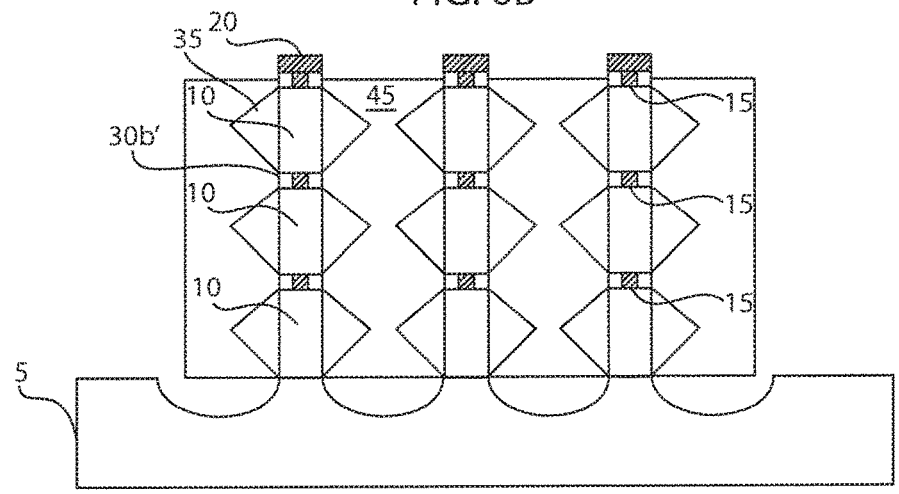
FIG. 7A is a side cross-sectional view depicting forming epitaxial crystalline semiconductor material on end portions of the stacked structure on opposing sides of the replacement gate structure, in accordance with one embodiment of the present disclosure.
Figure 7B:
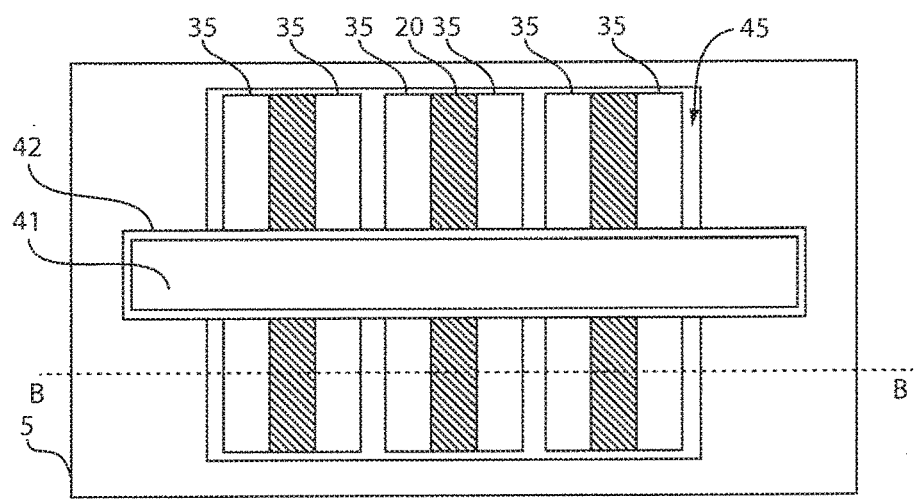
FIG. 7B is a top down view of the structure depicted in FIG. 7A.

FIGS. 7A and 7B depict forming epitaxial crystalline semiconductor material 45 on end portions of the stacked structure 25 on opposing sides of the replacement structure 40. FIG. 7A is a side cross sectional view along section line B-B depicted in FIG. 7B. In some embodiments, the epitaxial crystalline semiconductor material 45 may be formed of in situ doped, i.e., n-type and/or p-type doped, semiconductor material. By "in-situ" it is meant that the dopant that dictates the conductivity type of the epitaxial crystalline semiconductor material 45 is introduced during the process step, e.g., epitaxial deposition, which forms the epitaxial crystalline semiconductor material 45. In some embodiments, the epitaxial crystalline semiconductor material 45 is a merging structure that extends into contact between adjacent stacked structures 25. Although not depicted in the supplied figures embodiments have also been contemplated in which the in situ doped epitaxial crystalline semiconductor material 45 are not merging structures, but are formed on the sidewalls of adjacent stacking structures 25 without contacting each of the stacking structures 25. In some examples, this may be referred to as unmerged epitaxial crystalline semiconductor material 45.

In some embodiments, the epitaxially formed in situ doped epitaxial crystalline semiconductor material 45 is composed of a silicon containing material, such as silicon, silicon germanium, or silicon doped with carbon (Si:C). It is noted that the epitaxial crystalline semiconductor material may be formed using process steps suitable for forming the merged or unmerged portions of epitaxial semiconductor material that are formed on the source and drain region portions of fin structures used in finFET semiconductor devices. As illustrated above, the capacitor structure formed herein may be simultaneously formed with finFET semiconductor devices on the same semiconductor substrate.

In some embodiments, an interlevel dielectric layer (not shown) may be formed over the epitaxial crystalline semiconductor material 45, wherein an upper surface of the interlevel dielectric layer is planarized to be coplanar with an upper surface of the replacement structure 40. The interlevel dielectric layer may be selected from the group consisting of silicon-containing materials, such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The interlevel dielectric layer may be deposited using at least one of spinning from solution, spraying from solution, chemical vapor deposition (CVD), plasma enhanced CVD (PECVD), sputter deposition, reactive sputter deposition, ion-beam deposition, and evaporation.

Following deposition of the dielectric material for the interlevel dielectric layer, a planarization processes is conducted to provide an upper surface of the interlevel dielectric layer is coplanar with the upper surface of the replacement structure 40. The planarization of the interlevel dielectric layer can be provided by chemical mechanical planarization (CMP).

Figure 8A:
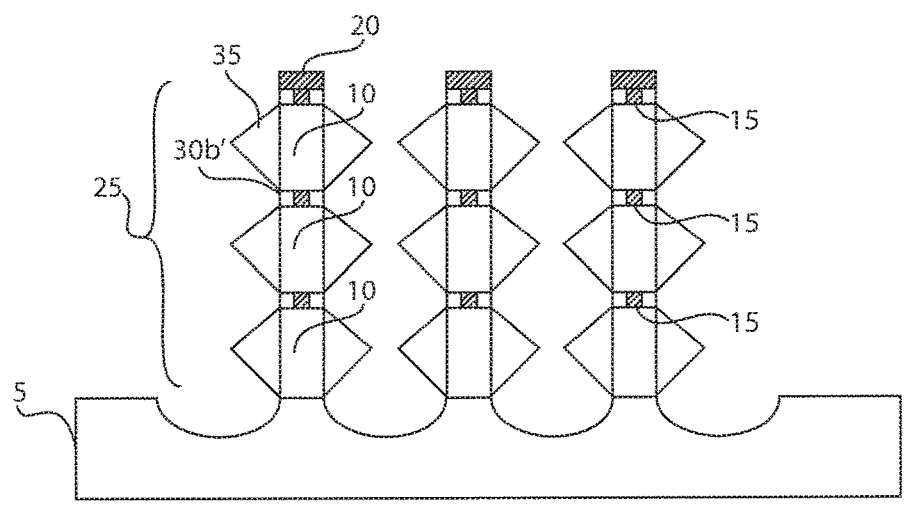
FIG. 8A is a side cross-sectional view depicting removing the replacement gate structure to expose the first portion of the stacked structure, in accordance with one embodiment of the present disclosure.
Figure 8B:
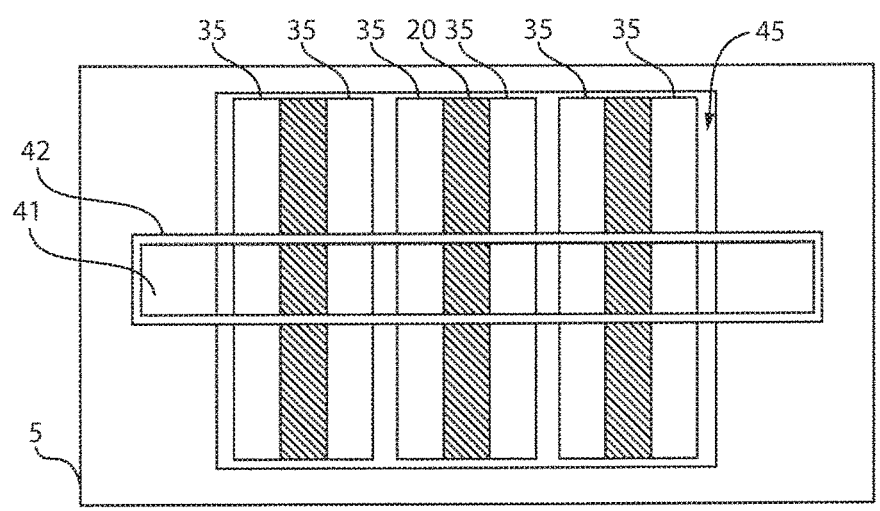
FIG. 8B is a top down view of the structure depicted in FIG. 8A.

FIGS. 8A and 8B depict removing the sacrificial material 41 of the replacement structure 40 to expose the first portion of the stacked structure 25. In one embodiment, the sacrificial material 41 of the replacement structure 40 may be removed by a selective etch. The replacement structure 40 may be removed using a wet or dry etch process. In one embodiment, the replacement structure 40 is removed by reactive ion etch (RIE). In one example, an etch step for removing the sacrificial material 41 of the replacement structure 40 selective to the stacked structures 25, the sidewall spacer 42, the substrate 5 and the interlevel dielectric.

Figure 9A:
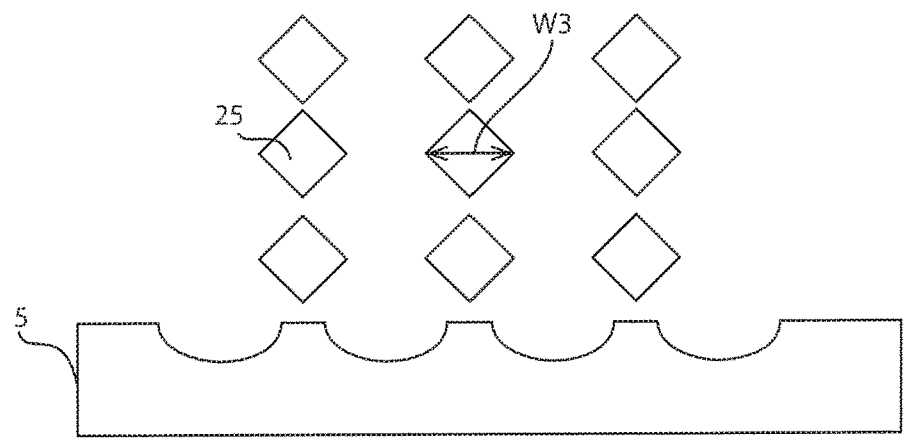
FIG. 9A is a side cross-sectional view of trimming the nanowires, in accordance with one embodiment of the present disclosure.
Figure 9B:
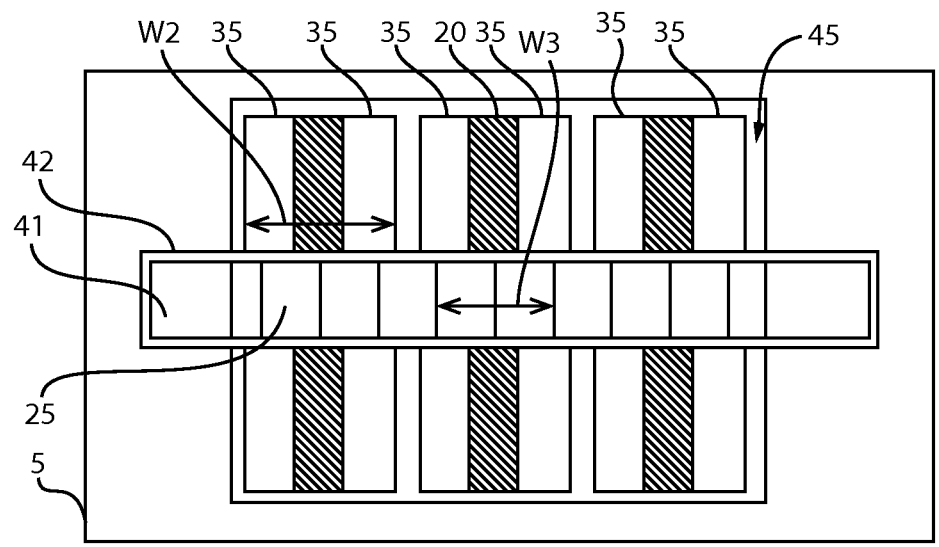
FIG. 9B is a top down view of the structure depicted in FIG. 9B.

FIGS. 9A and 9B depict trimming the stacked structures 25, which may hereafter be referred to as nanowires. Trimming the stacked structures 25 may include an etch process that removes the central portion of the hard mask layer 20 that is exposed by removing the sacrificial material 41 of the replacement structure 40. Remaining portions of the hard mask layer 20 may be present on the end portions of the stacked structures 25 that are covered by the interlevel dielectric layer. Trimming the stacked structures 25 to provide a plurality of separated and suspended structures, as depicted in FIG. 9A, may include an isotropic etch, such as a plasma etch or wet chemical etch. For example, when the second semiconductor material layer has been fully oxidized, and the first semiconductor material 10 and the epitaxial crystalline semiconductor material 45 are not strained, the second semiconductor material layer, i.e., oxide, may be removed by an etch that is selective to the first semiconductor material 10 and the epitaxial crystalline semiconductor material 45. Further, the etch that removes the oxide may trim an exterior portion of the epitaxial crystalline semiconductor material 45 to provide the geometry depicted in FIG. 9A.

The structure depicted in FIG. 9A may be referred to as being a plurality of suspended nanowires, in which the end portions of the stacked structures that are not exposed by removing the sacrificial material 41 provide anchors for supporting the nanowires. The end portions of the stacked structures covered with the epitaxial crystalline semiconductor material 45 and interlevel dielectric material are protected from being etched by the etch process that forms the first portion, i.e, central portion, of the stacked structure that is exposed by removing the sacrificial material 41.

In some embodiments, the multi-sided cross section, e.g., square or rectangular cross section, of the remaining portion of the trimmed stacked structure 25 depicted in FIG. 9A may be smoothed using a hydrogen anneal to form elliptical shaped or cylindrical shaped suspended nanowires, wherein in some embodiments the suspended nanowires include a circular geometry cross-section or oblong geometry cross-section. In some embodiments, the hydrogen anneal that is employed in the present disclosure can be performed at a temperature from 600° C. to 1000° C. The pressure of hydrogen used during the hydrogen anneal can range from 5 torr to 600 torr. It is noted that the above described parameters for the hydrogen anneal are provided for illustrative purposes only, and are not intended to limit the present disclosure.

It is noted that trimming of the stacked structures 25, i.e., nanowires, as depicted in FIG. 9, is optional and may be omitted. The stacked structures 25 may hereafter be referred to as nanowires 25.

The trimmed nanowires 25 depicted in FIG. 9A may have a cross sectional width W3 ranging from 5 nm to 195 nm. In another embodiment, the nanowires 25 depicted in FIG. 9A may have a cross sectional width W3 ranging from 25 nm to 55 nm.

In some embodiments, to provide an electrode for the capacitor structure provided by the present method, the nanowires 25 may be doped, i.e., n-type or p-type doped, to provide electrical conductivity to the nanowires 25, i.e., first electrode of the capacitor structure. The nanowires 25 may be doped using gas phase doping, plasma doping, boron deposition, in-diffusion of n-type or p-type dopants, or a combination thereof.

Figure 10:
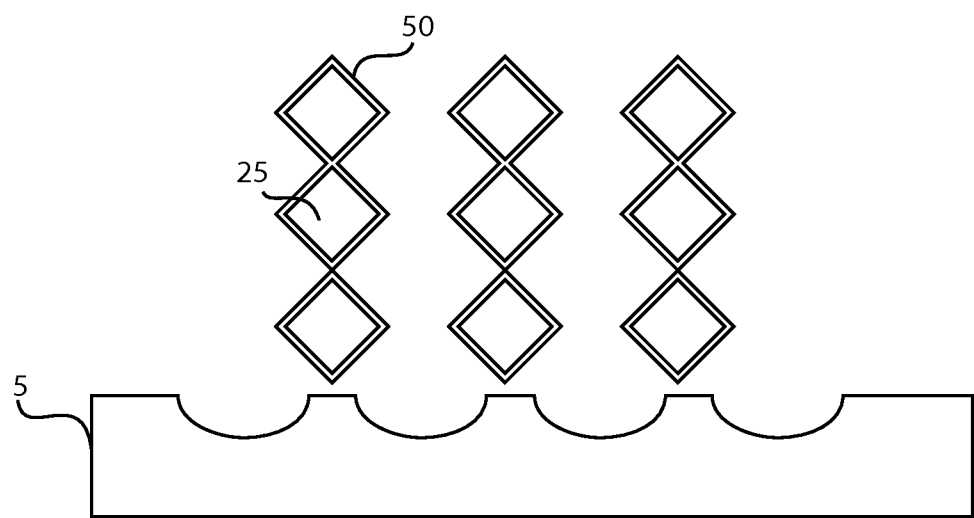
FIG. 10 is a side cross-sectional view of forming a dielectric layer on exposed portions of the nanowires, in accordance with one embodiment of the present disclosure.

FIG. 10 depicts one embodiment of forming a dielectric layer 50 on exposed portions of the nanowires 25. In the embodiments, in which the nanowires 25 provide a first electrode of the capacitor structure, the dielectric layer 50 that is formed on the nanowires 25 provides the node dielectric of the capacitor structure. The dielectric layer 50 may be composed of an oxide, such as silicon oxide ($SiO_2$), nitride, such as silicon nitride, a silicon oxynitride, or a combination thereof. In another example, the dielectric layer 50 may be composed of a high-k dielectric material. The term "high-k" denotes a material having a dielectric constant that is greater than the dielectric constant of silicon oxide ($SiO_2$). For example, a high-k dielectric material typically has a dielectric constant that is greater than 4.0. In another example, a high-k dielectric material that may be employed for the dielectric layer 50 has a dielectric constant that is greater than the 10. In yet another embodiment, the high-k gate dielectric layer is comprised of a material having a dielectric constant ranging from 10 to 30. The dielectric constants mentioned herein are relative to a vacuum at room temperature, i.e., 20° C. to 25° C., at atmospheric pressure, i.e., 1 atm. Some examples of high-k dielectric materials suitable for the dielectric layer 50 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the dielectric layer 50 is hafnium oxide ($HfO_2$).

The dielectric layer 50 may be deposited using a chemical vapor deposition method, such as plasma enhanced chemical vapor deposition (PECVD), and may be formed around an entirety of the circumference of the exposed portions of the suspended nanowires 25. The thickness of the dielectric layer 50 may range from 0.5 nm to 10 nm. In one example, the dielectric layer 50 may have a thickness ranging from 1 nm to 2 nm.

It is noted that the forming of the dielectric layer 50 for forming the capacitor structure may be performed simultaneously with forming the functional gate dielectric of the gate structure to a finFET, in which the capacitor structure and the finFET are being formed on different portions of the same substrate 5.

Figure 11A:
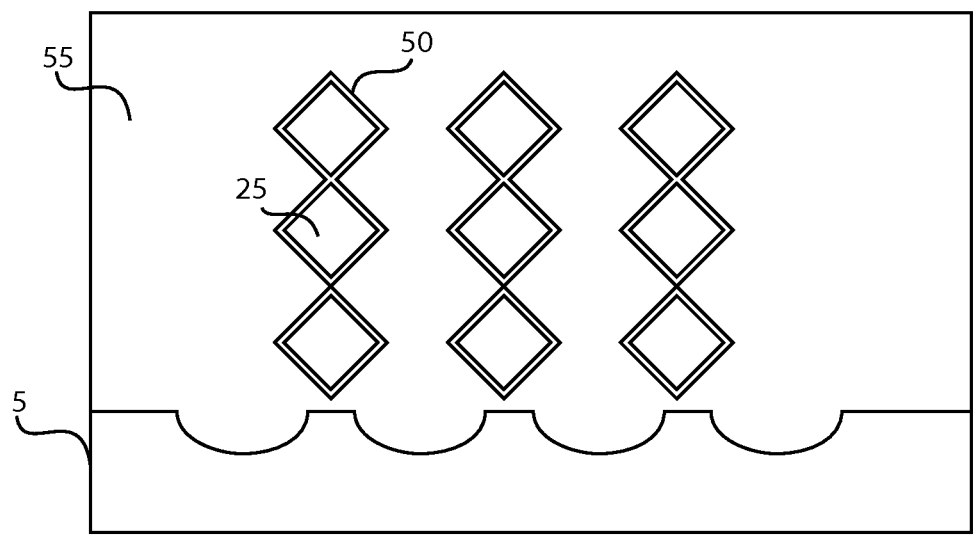
FIG. 11A is a side cross-sectional view of forming a conductive material on the dielectric layer, wherein the stacked structure including the epitaxial material the dielectric layer and the conductive material provide a capacitor structure.
Figure 11B:
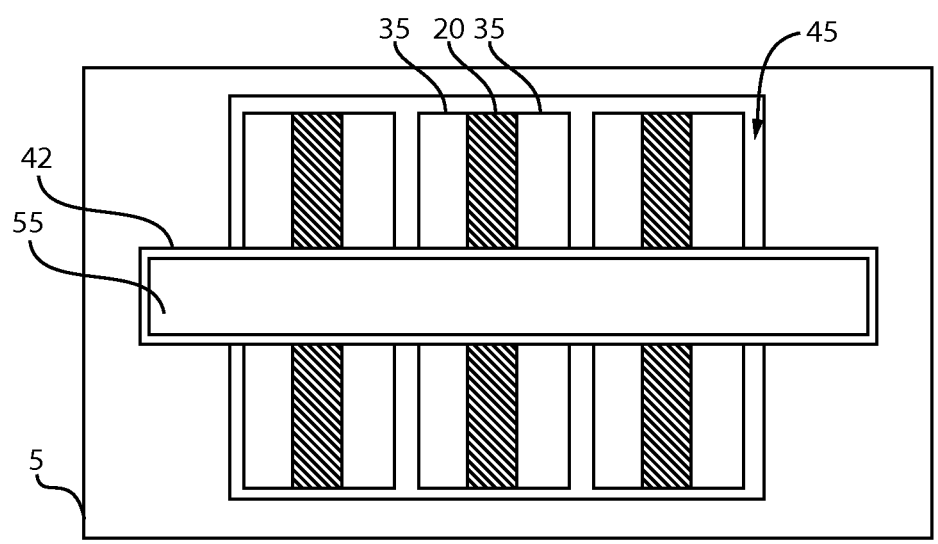
FIG. 11B is a top down view of the structure depicted in FIG. 11A.

FIGS. 11A and 11B depict forming a conductive material 55 on the dielectric layer 50. In this embodiment, the nanowires 25, also referred to as the stacked structure including the epitaxial material, the dielectric layer 50 and the conductive material 55 provide a capacitor structure. The conductive material 55 and the nanowires 25 provide the electrodes of the capacitor structure, and the dielectric layer 50 provides the node dielectric of the capacitor positioned between and separating the electrodes of the capacitor structure. In some embodiments, a blanket layer of a conductive material 55 is formed on the dielectric layer 50 utilizing a deposition process, such as physical vapor deposition (PVD), CVD or evaporation. The conductive material 55 may comprise polysilicon, SiGe, a silicide, a metal or a metal-silicon-nitride such as Ta—Si—N. Examples of metals that can be used as the conductive material 55 include, but are not limited to, Al, W, Cu, and Ti or other like conductive metals. The blanket layer of conductive material 55 may be doped or undoped. If doped, an in-situ doping deposition process may be employed. Alternatively, a doped conductive material 55 can be formed by deposition, ion implantation and annealing.

Following formation of the conductive material 55, electrical contacts may be formed to the electrodes of the capacitor structure, in which the electrodes are provided by the conductive material 55 and the nanowires 25. Each contact may be composed of an electrically conductive material, such as doped polysilicon or a metal, e.g, aluminum, tungsten, copper, platinum, gold, silver and alloys thereof. The contact to the nanowires 25 may be formed through the interlevel dielectric layer that is present over the epitaxial crystalline semiconductor material 45, wherein contact to the epitaxial crystalline semiconductor material 45 may provide electrical communication to the nanowires. A separate contact is made to the conductive material 55.

The capacitors structure provided by the present disclosure may include a plurality of nanowires 25 having a central portion with a cross-sectional width W3 less than a cross sectional width W2 of end portions for the nanowires; and a node dielectric layer 50 on the central portion of the plurality of nanowires 25. A conductive material 55 is present on the node dielectric layer 50. The conductive material 55, the node dielectric layer 50 and the central portion of the nanowires 25 provides the capacitor. The central portion of the plurality of nanowires has a multisided or substantially circular cross-section. In some embodiments, the cross-sectional width W3 of the central portion of the nanowires ranges from 5 nm to 95 nm, and the cross sectional width W2 of the end portions of the nanowires ranges from 25 nm to 55 nm.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming an electrical device comprising:
   forming a stacked structure of at least a first semiconductor material layer and a second semiconductor material layer, wherein a material of the first and second semiconductor material layers have different oxidation rates;
   oxidizing a sidewall of the stacked structure to form an oxide layer, wherein a first thickness of a first portion of the oxide layer that is present on the first semiconductor material layer is different from a second thickness of a second portion of the oxide layer that is present on the second semiconductor material layer;
   removing the first or second portion of the oxide layer having a lesser thickness to provide an exposed surface of the stacked structure;
   forming a replacement structure on a first portion of the stacked structure;
   forming an epitaxial semiconductor material on the exposed surface of the stacked structure, wherein portions of the stacked structure having the epitaxial semiconductor material has a greater width than portions of the stacked structure not including the epitaxial semiconductor material;
   forming an epitaxial crystalline semiconductor material on end portions of the stacked structure on opposing sides of the replacement structure;
   forming a dielectric layer on exposed portions of the stacked structure having the epitaxial semiconductor material; and
   forming a conductive material on the dielectric layer.

2. The method of claim 1, wherein the first semiconductor material layer has a composition that is selected from the group consisting of Si, SiGe, SiGeC, a III-V semiconductor material and a combination thereof.

3. The method of claim 1, wherein the second semiconductor material layer has a composition that is selected from the group consisting of SiGe, a III-V semiconductor material and a combination thereof.

4. The method of claim 1, wherein the first semiconductor material layer is comprised of $Si_{1-x}Ge_x$, wherein x=0-0.5, and the second semiconductor material layer is comprised of $Si_{1-y}Ge_y$, wherein y>x.

5. The method of claim 1, wherein oxidizing the sidewall of the stacked structure comprises thermal oxidation.

6. The method of claim 1, wherein the removing of the first or second portion of the oxide layer comprises an isotropic etch.

7. The method of claim 1, wherein forming the epitaxial semiconductor material comprises a homogeneous or heterogeneous material combination.

8. The method of claim 1, wherein forming the replacement structure includes forming a dielectric sidewall spacer on a sidewall of the replacement structure.

9. The method of claim 1, further comprising:
forming an interlevel dielectric layer (IDL) on at least the epitaxial crystalline semiconductor material;
removing the replacement structure to expose the first portion of the stacked structure;
etching the first portion of the stacked structure to form at least one nanowire geometry; and
doping the first portion of the stacked structure having the at least one nanowire geometry.

10. The method of claim 9, wherein said forming of the dielectric layer on the exposed portions of the stack structure comprises forming the dielectric layer on the at least one nanowire geometry.

11. The method of claim 10, wherein the dielectric layer is present around an entirety of an exterior surface of the at least one nanowire geometry.

12. The method of claim 11, wherein the forming the conductive material on the dielectric layer comprises doped polysilicon or a metal.

* * * * *